United States Patent
Zhang

(10) Patent No.: US 11,557,634 B2
(45) Date of Patent: Jan. 17, 2023

(54) DISPLAY PANEL AND DISPLAY MODULE WITH VARIABLE SUB-PIXEL OPENING AREA

(71) Applicant: Wuhan China Star Optoelectronics Technology Co., LTD., Wuhan (CN)

(72) Inventor: Hongsen Zhang, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/651,253

(22) PCT Filed: Nov. 11, 2019

(86) PCT No.: PCT/CN2019/117099
§ 371 (c)(1),
(2) Date: Mar. 26, 2020

(87) PCT Pub. No.: WO2021/056721
PCT Pub. Date: Apr. 1, 2021

(65) Prior Publication Data
US 2022/0216272 A1    Jul. 7, 2022

(30) Foreign Application Priority Data
Sep. 26, 2019    (CN) .......................... 201910915885.0

(51) Int. Cl.
*H01L 27/32* (2006.01)
(52) U.S. Cl.
CPC ................ *H01L 27/3216* (2013.01)

(58) Field of Classification Search
CPC ................................................. H01L 27/3216
See application file for complete search history.

(56) References Cited

U.S. PATENT DOCUMENTS

| 11,009,911 B2* | 5/2021 | Lin ..................... G06F 1/1637 |
| 11,233,095 B2* | 1/2022 | Lv ........................ H01L 51/56 |
| 2010/0289994 A1* | 11/2010 | Nonaka .................. G09G 3/20 |
| | | 349/108 |
| 2017/0261825 A1 | 9/2017 | Li |
| 2018/0130397 A1 | 5/2018 | Zheng et al. |
| 2018/0374401 A1 | 12/2018 | Yang et al. |
| 2019/0140026 A1* | 5/2019 | Nakanishi .......... H01L 27/3211 |

(Continued)

FOREIGN PATENT DOCUMENTS

| CN | 107422516 A | 12/2017 |
| CN | 107507522 A | 12/2017 |

(Continued)

*Primary Examiner* — Kwang-Su Yang
(74) *Attorney, Agent, or Firm* — Lowenstein Sandler LLP

(57) ABSTRACT

The present application provides a display panel and a display module with variable sub-pixel opening area. The display panel includes a display area, a non-display area, and a transition area disposed between the display area and the non-display area. The transition area comprises a first sub-pixel area and a second sub-pixel area, and the first sub-pixel area comprises a first opening and the second sub-pixel area comprises a second opening. The first opening is disposed closer to the display area than the second opening, and the first opening has an area greater than the area of the second opening.

8 Claims, 6 Drawing Sheets

(56) References Cited

U.S. PATENT DOCUMENTS

2019/0156782 A1 5/2019 Yamaguchi et al.
2020/0110200 A1 4/2020 Zang et al.

FOREIGN PATENT DOCUMENTS

| CN | 107526201 A  | 12/2017 |
|----|--------------|---------|
| CN | 107731101 A  | 2/2018  |
| CN | 108269505 A  | 7/2018  |
| CN | 208271899 U  | 12/2018 |
| CN | 109870846 A  | 6/2019  |
| CN | 110047875 A  | 7/2019  |
| CN | 110071142 A  | 7/2019  |
| WO | 2017133180 A1| 8/2017  |

* cited by examiner

DISPLAY PANEL AND DISPLAY MODULE WITH VARIABLE SUB-PIXEL OPENING AREA

BACKGROUND OF INVENTION

Field of Invention

The present application relates to the display technology field, and particularly to a display panel and a display module.

Description of Prior Art

In existing display devices, full screen display panels are divided into irregular-shaped display panels and non-irregular-shaped display panels. Along with increasingly higher screen-to-body ratio, irregular-shaped display panels are becoming popular in the mobile phone market.

To achieve targets of high screen-to-body ratio and good visual appearance, partial edges of a display area of an existing irregular-shaped display panel, such as edges of chamfers, grooves, holes, and so on, are usually processed as arcs. Pixels located near the arc edges need to be processed to ensure smooth display performance in arc areas of the display panel. In the prior art, black matrix material is used to shade sub-pixels outside the arc edges. However, such technical solution will result in zigzag pattern appearance in the arc areas, which affects display effect.

Hence, a new technical solution is needed to solve the above technical problem.

SUMMARY OF INVENTION

The present application provides a display panel and a display module to solve the existing technical problem of zigzag pattern appearance in the arc areas of the display panel.

Technical solutions provided in the present application are as follows:

Embodiments of the present application provide a display panel, comprising: a display area; a non-display area; and a transition area disposed between the display area and the non-display area, wherein the transition area comprises at least a first sub-pixel area arranged along a first direction and/or a second direction, and any one of first sub-pixel areas comprises at least a first opening; and wherein an area of the first opening disposed close to the display area is greater than an area of the first opening disposed away from the display area.

In the display panel of present application, areas of first openings in the first sub-pixel area decrease gradually in a direction from the display area to the transition area.

In the display panel of present application, the transition area comprises at least a first pixel area arranged along the first direction and/or the second direction, and any one of first pixel areas comprises at least one of the first sub-pixel areas; and wherein the areas of the first openings in the first sub-pixel areas decrease gradually in the first direction and/or the second direction.

In the display panel of present application, any one of the first pixel areas comprises three first sub-pixels arranged along the first direction; colors of the first sub-pixels in any one of the first pixel areas are different from each other; and a first sub-pixel comprises one of red sub-pixel, green sub-pixel, or blue sub-pixel.

In the display panel of present application, any one of the first sub-pixel areas at least comprises the first opening disposed close to the display area and a second opening disposed away from the display area, and the first opening and the second opening are arranged along the first direction or the second direction; and wherein an area of the second opening is smaller than the area of the first opening.

In the display panel of present application, the first opening and the second opening are arranged along the second direction; a line corresponding to centers of the first openings in a same one of the first pixel areas is parallel to the first direction, and a line corresponding to centers of second openings in the same one of the first pixel areas is parallel to the first direction; and the areas of the first openings in the same one of the first pixel areas are equal to each other, and areas of the second openings in the same one of the first pixel areas are equal to each other.

In the display panel of present application, a number of openings in the first sub-pixel area disposed close to the display area is greater than a number of openings in the first sub-pixel area disposed away from the display area.

In the display panel of present application, the first opening and the second opening are arranged along the second direction; the areas of the first openings in a same one of the first pixel areas are not equal to each other, and the areas of the second openings in the same one of the first pixel areas are not equal to each other; and in the direction from the display area to the transition area, the areas of the first openings in the first pixel area decrease gradually, and the areas of the second openings in the second pixel area decrease gradually.

In the display panel of present application, in a top view of the display panel, the transition area is an irregular straight line.

Embodiments of the present application also provide a display module, comprising a display panel, wherein the display panel comprises: a display area; a non-display area; and a transition area disposed between the display area and the non-display area, wherein the transition area comprises at least a first sub-pixel area arranged along a first direction and/or a second direction, and any one of first sub-pixel areas comprises at least a first opening; and wherein an area of the first opening disposed close to the display area is greater than an area of the first opening disposed away from the display area.

In the display module of present application, areas of first openings in the first sub-pixel area decrease gradually in a direction from the display area to the transition area.

In the display module of present application, the transition area comprises at least a first pixel area arranged along the first direction and/or the second direction, and any one of first pixel areas comprises at least one of the first sub-pixel areas; and wherein the areas of the first openings in the first sub-pixel areas decrease gradually in the first direction and/or the second direction.

In the display module of present application, any one of the first pixel areas comprises three first sub-pixels arranged along the first direction; colors of the first sub-pixels in any one of the first pixel areas are different from each other; and a first sub-pixel comprises one of red sub-pixel, green sub-pixel, or blue sub-pixel.

In the display module of present application, any one of the first sub-pixel areas at least comprises the first opening disposed close to the display area and a second opening disposed away from the display area, and the first opening and the second opening are arranged along the first direction or the second direction; and wherein an area of the second opening is smaller than the area of the first opening.

In the display module of present application, the first opening and the second opening are arranged along the second direction; a line corresponding to centers of the first openings in a same one of the first pixel areas is parallel to the first direction, and a line corresponding to centers of second openings in the same one of the first pixel areas is parallel to the first direction; and the areas of the first openings in the same one of the first pixel areas are equal to each other, and areas of the second openings in the same one of the first pixel areas are equal to each other.

In the display module of present application, a number of openings in the first sub-pixel area disposed close to the display area is greater than a number of openings in the first sub-pixel area disposed away from the display area.

In the display module of present application, the first opening and the second opening are arranged along the second direction; the areas of the first openings in a same one of the first pixel areas are not equal to each other, and the areas of the second openings in the same one of the first pixel areas are not equal to each other; and in the direction from the display area to the transition area, the areas of the first openings in the first pixel area decrease gradually, and the areas of the second openings in the second pixel area decrease gradually.

In the display module of present application, in a top view of the display panel, the transition area is an irregular straight line.

Advantageous effect: In the present application, the sub-pixel areas of the transition area comprise a plurality of openings, wherein the area of the opening disposed close to the display area is greater than the area of the opening disposed away from the display area, resulting in increased luminance of the sub-pixel area, which eliminates a zigzag pattern between the display area and the non-display area and improves the display effect of the display panel.

BRIEF DESCRIPTION OF DRAWINGS

To clearly describe the technical solutions of the embodiments of the present application, a brief description of figures for the embodiments of the present invention is listed as follows. The figures described below correspond to a few embodiments of the present application. A person skilled in the art can obtain other figures according to these figures without creative work.

DETAILED DESCRIPTION OF PREFERRED EMBODIMENTS

The following description is for illustrating a specific embodiment available in the present application with reference of the FIGs. Terms about directions mentioned in the present application, for example, "up", "down", "front", "back", "left", "right", "interior", "exterior", "lateral", and so on, are illustrating directions with reference of the FIGs, they are for improving better description and understanding of the present application only, but not for limiting the present application. In the FIGs, same things are represented by same reference signs.

Partial edges of a display area of an irregular-shaped display panel, such as edges of chamfers, grooves, holes, and so on, are usually processed as arcs. Pixels located near the arc edges need to be processed to ensure smooth display performance in arc areas of the display panel. In the prior art, black matrix material is used to shade sub-pixels outside the arc edges. However, such technical solution will result in zigzag pattern appearance in the arc areas, which affects display effect. The present application provides following technical solutions based on the above technical problem.

Figure 1:
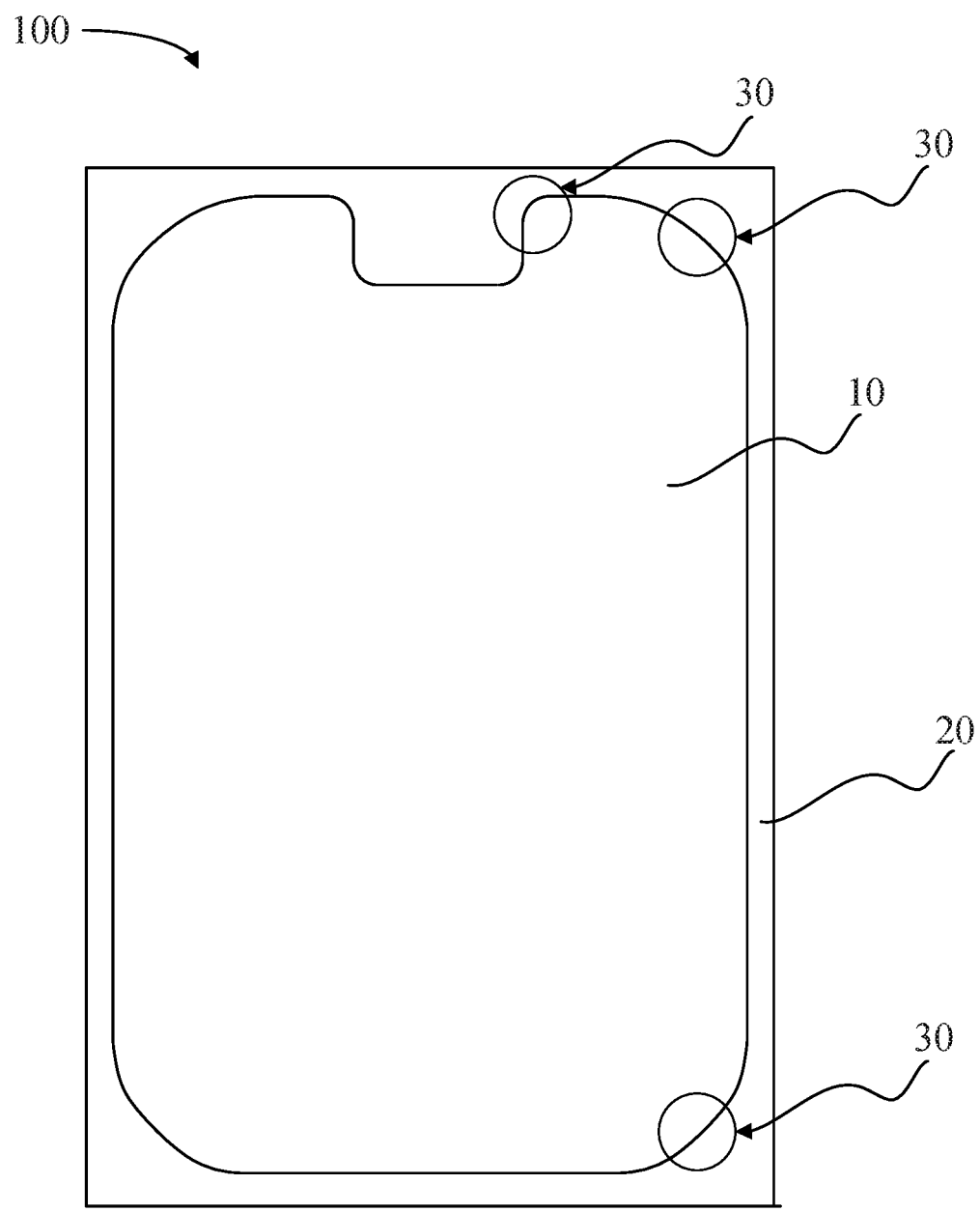
FIG. 1 is a top view structural diagram of a display panel of the present application.

Refer to FIG. 1, a display panel 100 comprises a display area 10, a non-display area 20, and a transition area 30 disposed between the display area 10 and the non-display area 20.

Figure 2:
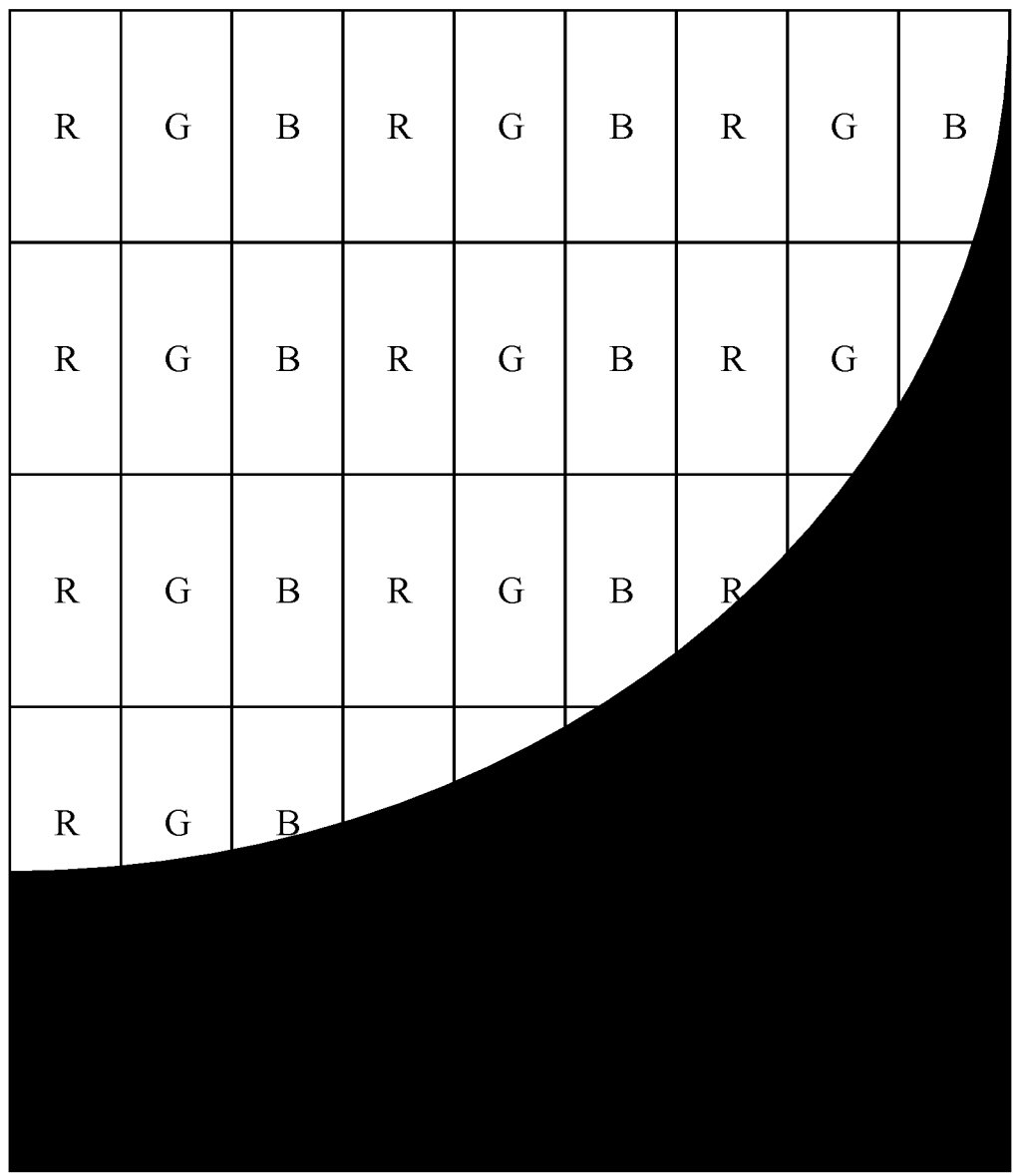
FIG. 2 is a structural brief diagram of a transition area of a display panel of the present application.
Figure 3:
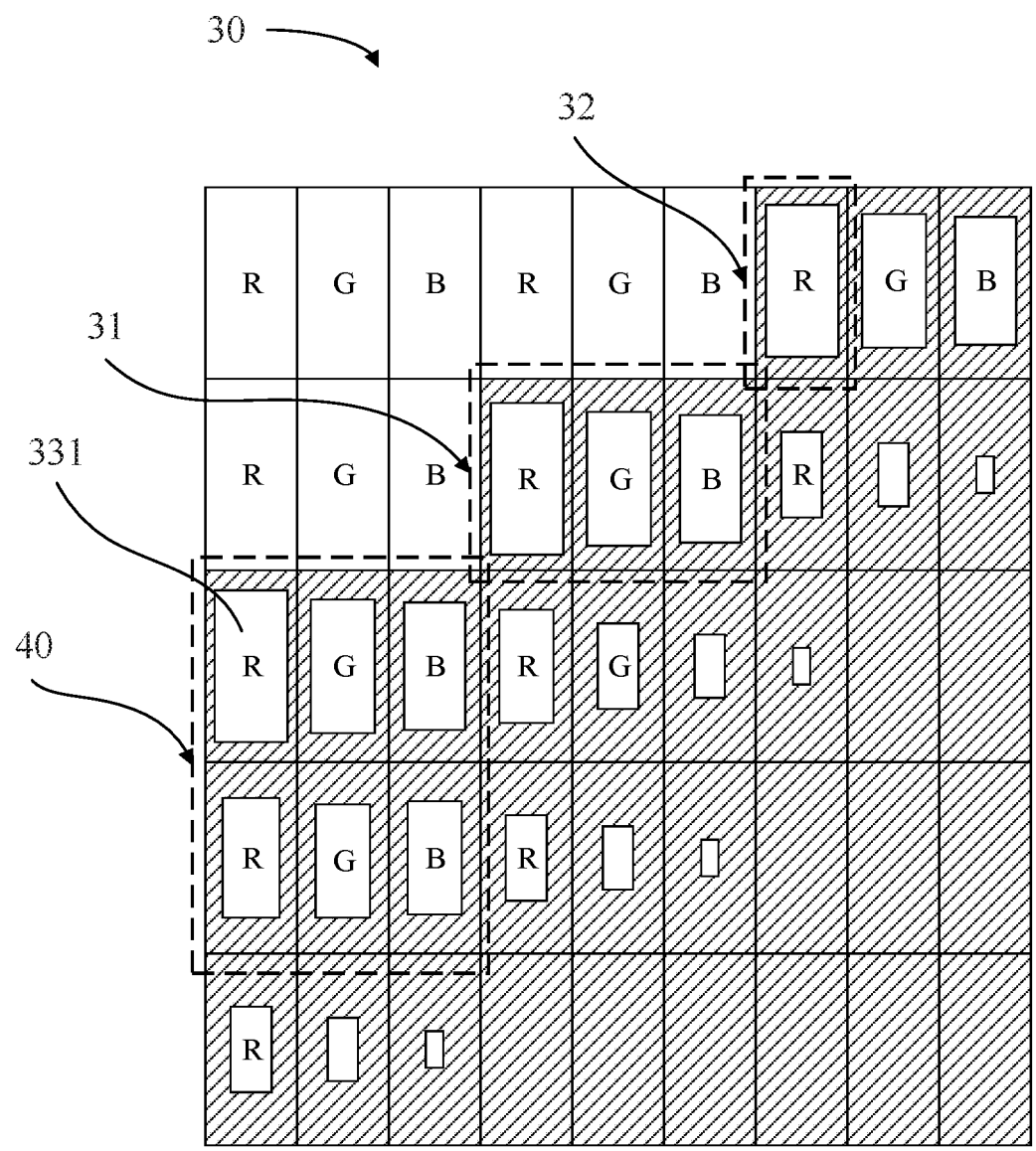
FIG. 3 is a first structural diagram of a transition area of a display panel of the present application.

Refer to FIG. 2 to FIG. 3, the transition area 30 comprises at least a first sub-pixel area 32 arranged along a first direction X and/or a second direction Y, wherein any one of the first sub-pixel areas 32 comprises at least a first opening 331.

The first direction X is parallel to an X direction, the second direction Y is parallel to a Y direction.

The first sub-pixel area 32 comprises a first sub-pixel, and the first sub-pixel can be one of red sub-pixel, green sub-pixel, or blue sub-pixel.

An area of the first opening 331 disposed close to the display area 10 is greater than an area of the first opening 331 disposed away from the display area 10.

Sub-pixel areas of the transition area 30 in the present application comprise a plurality of openings, wherein an area of an opening disposed close to the display area 10 is greater than an area of an opening disposed away from the display area 10, resulting in an increased luminance of a sub-pixel area, which eliminates a zigzag pattern between the display area 10 and the non-display area 20 and improves a display effect of the display panel 100.

Embodiments of the present application may be applied to a standard RGB pixel arrangement and a pentile arrangement. Following will illustrate the present application with the standard RGB pixel arrangement as an example.

In the top view direction of the display panel 100, the transition area 30 can be viewed as an irregular straight line. In the standard RGB pixel arrangement, pixels are generally arranged in a direction which is parallel to a long edge and/or a short edge of the display panel 100. For an edge of the display panel 100 which is not parallel to the long edge and/or the short edge of the display panel 100, a shading process is needed for the pixels in this area. Refer to FIG. 1, edges of an area A and an excavated area are both arcs with certain radians which can be set according to a practical situation.

The transition area 30 can be located in the display area 10 or the non-display area 20, or, the transition area 30 can be located between the display area 10 and the non-display area 20. In order to ensure the display effect, the transition area 30 is located between the display area 10 and the non-display area 20, that is, the transition area 30 is located at both sides of an arc. By setting the openings in the corresponding sub-pixel areas, gradually increased gray scales are presented in the sub-pixels along a direction from the display area 10 to the transition area 30, that is, luminance of the sub-pixels is gradually decreased along a direction from the display area 10 to the transition area 30.

Refer to FIG. 3, areas of first openings 331 in the first sub-pixel area 32 decrease along a direction from the display area 10 to the transition area 30.

The transition area 30 comprises at least a first pixel area 31 arranged along the first direction X and/or the second direction Y, wherein any one of first pixel areas 31 comprises at least a first sub-pixel area 32. The areas of the first openings 331 in the first sub-pixel area 32 decrease along the first direction X and/or the second direction Y.

Refer to FIG. 3, any one of the first pixel areas 31 in the present embodiment comprises three first sub-pixels arranged along the first direction X. Colors of the first sub-pixels in any one of first pixel areas 31 are different from each other.

Take the standard RGB pixel arrangement for example, any one of pixels comprises a red sub-pixel, a green sub-pixel, and a blue sub-pixel.

The areas of the first openings 331 corresponding to the first sub-pixel areas 32 located in a same one of the first pixel areas 31 are set to be unequal to each other according to locations of the arcs corresponding to the sub-pixels. For example, for three of the sub-pixels in a first area 40 of the transition area 30, an area of a part of the red sub-pixel corresponding to the display area 10 is the largest, an area of a part of the blue sub-pixel corresponding to the display area 10 is the smallest, and an area of a part of the green sub-pixel corresponding to the display area 10 is in between. During the process of setting the areas of the first openings 331, the area of the first opening 331 corresponding to a red sub-pixel area is set as the largest, the area of the first opening 331 corresponding to a blue sub-pixel area is set as the smallest, and the area of the first opening 331 corresponding to a green sub-pixel area is set as in between. In the above embodiments, except for the first opening 331, the areas corresponding to the first sub-pixel area 32 are all covered by a shading material.

The areas of the first openings 331 are differentiated by differentiating areas of shading areas in the sub-pixel areas; therefore, the area of the opening disposed close to the display area 10 is greater than the area of the opening disposed away from the display area 10, resulting in increased luminance of the sub-pixel, which eliminates the zigzag pattern between the display area 10 and the non-display area 20 and improves the display effect of the display panel 100.

Figure 4:
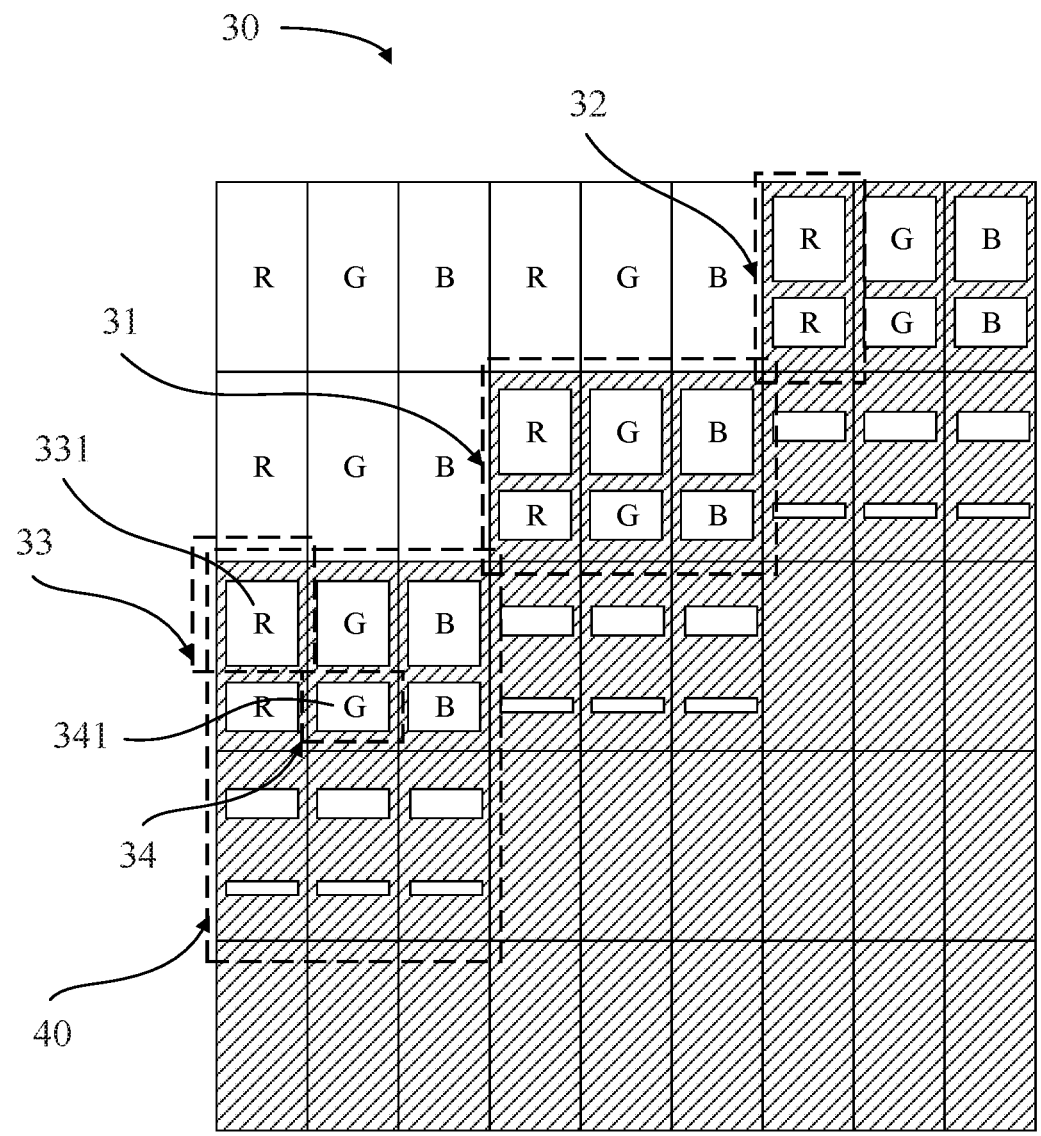
FIG. 4 is a second structural diagram of a transition area of a display panel of the present application.

Refer to FIG. 4, the present embodiment is the same as or similar to that shown in FIG. 3, the difference being:

Any one of the first sub-pixel areas 32 at least comprises the first opening 331 disposed close to the display area 10 and a second opening 341 disposed away from the display area 10, wherein the first opening 331 and the second opening 341 are arranged along the first direction X and/or the second direction Y.

Wherein, an area of the second opening 341 is smaller than the area of the first opening 331.

The first opening 331 shown in FIG. 3 is divided into the first opening 331 and the second opening 341 shown in FIG. 4. Gray scale levels of the transition area 30 of the display panel 100 are added. The first opening 331 and the second opening 341 are arranged along the second direction Y.

A line corresponding to centers of the first openings 331 in a same one of the first pixel areas 31 is parallel to the first direction X, and a line corresponding to centers of second openings 341 in the same one of the first pixel areas 31 is parallel to the first direction X.

The areas of the first openings 331 in the same one of the first pixel areas 31 can be equal to each other, and areas of the second openings 341 in the same one of the first pixel areas 31 can be equal to each other.

In the prior art, pure white of the display area 10, some gray scale values of the transition area 30, and pure black of the non-display area 20 are presented from the display area 10 to the non-display area 20.

The first sub-pixel area 32 of the transition area 30 is divided into the first opening area 33 and the second opening area 34, wherein the first opening 331 is located in the first opening area 33, the second opening 341 is located in the second opening area 34, and the area of the second opening 341 disposed away from the display area 10 is smaller than the area of the first opening 331 disposed close to the display area 10. Therefore, pure white of the display area 10, first gray scale value of the transition area 30, second gray scale value of the transition area 30, and pure black of the non-display area 20 are presented from the display area 10 to the non-display area 20.

Compared with the prior art, gray scale values between the display area 10 and the non-display area 20 are added in the present embodiment, a picture transited from pure white to pure black become more uniform, and the zigzag pattern of the picture existing in the prior art is eliminated.

Figure 5:
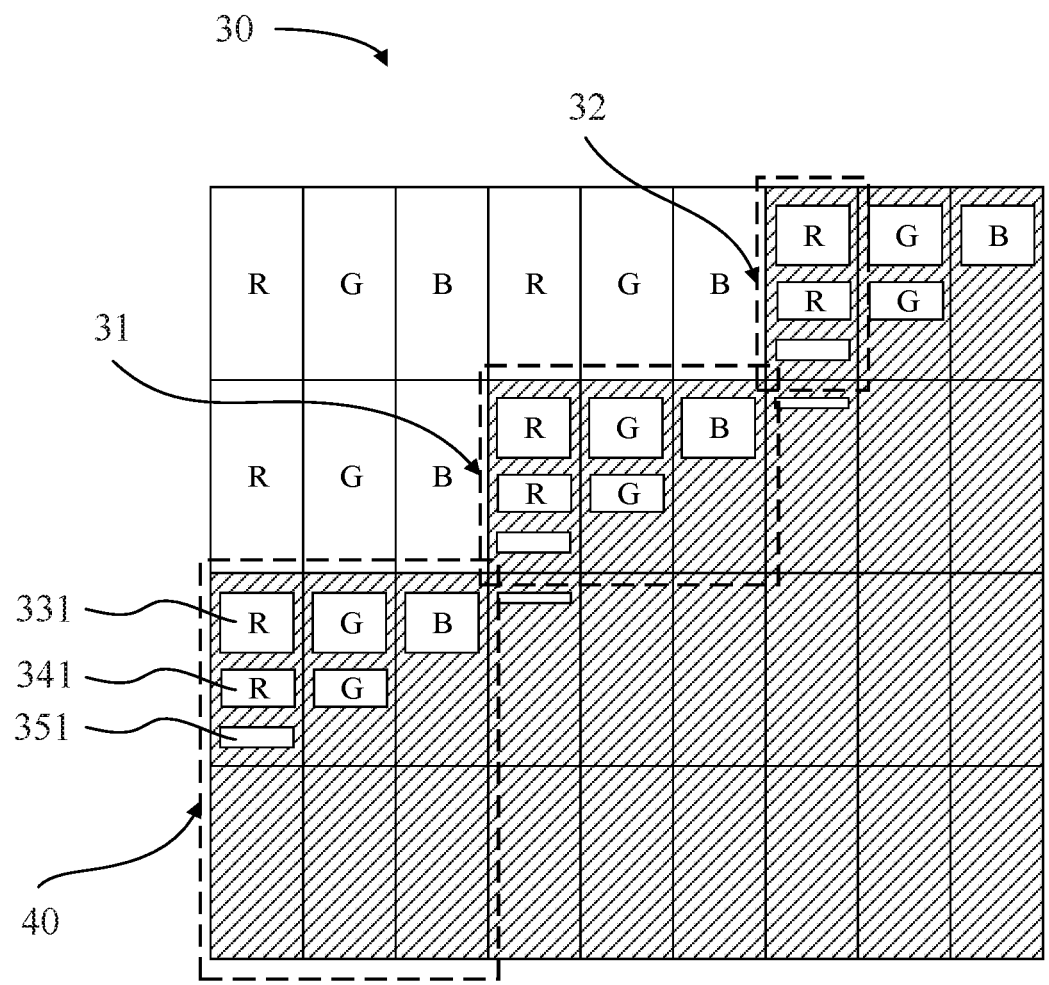
FIG. 5 is a third structural diagram of a transition area of a display panel of the present application.

Based on the FIG. 5, any one of the first sub-pixel areas 32 can comprise a third opening 351, a fourth opening, and so on, which adds more gray scale values between the display area 10 and the non-display area 20, making a transition of the picture from pure white to pure black become more uniform and improving the display effect. A number of the openings in any one of the first sub-pixel areas 32 is not limited in the present application.

Refer to FIG. 5, a number of the openings of the first sub-pixel area 32 disposed close to the display area 10 is greater than a number of the openings of the first sub-pixel area 32 disposed away from the display area 10.

An area of a part of the first sub-pixel area 32 disposed close to the display area 10 corresponding to the display area 10 is the largest, and an area of a part of the first sub-pixel area 32 disposed away from the display area 10 corresponding to the display area 10 is the smallest. For example, in the transition area 30, an area of a part of the red sub-pixel of the first area 40 located in the display area 10 is the largest, an area of a part of the blue sub-pixel corresponding to the display area 10 is the smallest, and an area of a part of the green sub-pixel corresponding to the display area 10 is in between. A first opening 331, a second opening 341 and a third opening 351 are set in the red sub-pixel area, a first opening 331 and a second opening 341 are set in the green sub-pixel area, a first opening 331 is set in the blue sub-pixel area.

A number of the openings of the red sub-pixels is the greatest, a number of the openings of the blue sub-pixels is the least, and a number of the openings of the green sub-pixels is in between. A number of the openings is set according to areas of the sub-pixels corresponding to the display area 10, which ensures not only the genuineness of the gray scale in the original picture, but also the uniformity of the transition of the picture from the display area 10 to the non-display area 20.

Figure 6:
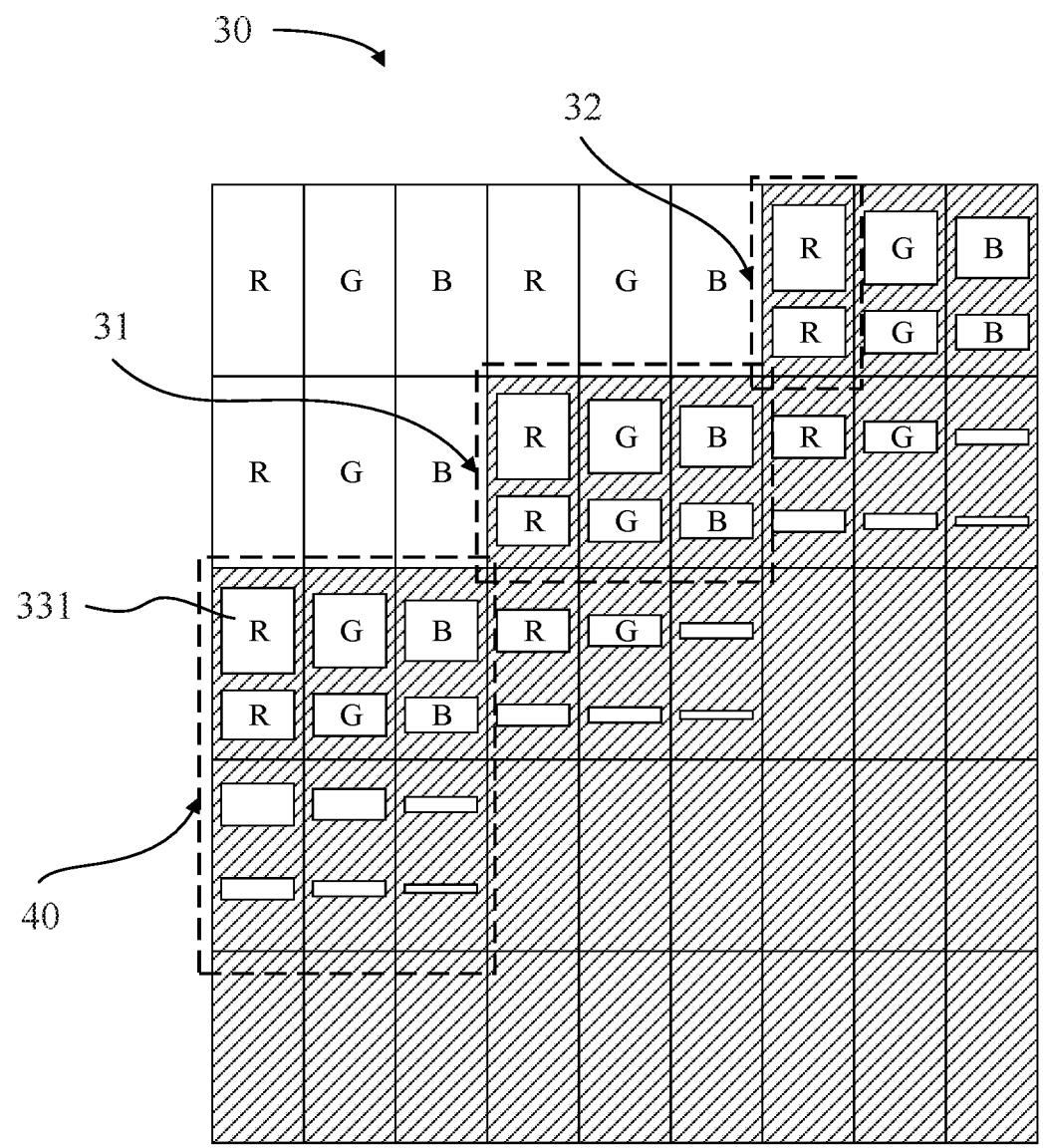
FIG. 6 is a fourth structural diagram of a transition area of a display panel of the present application.

Refer to FIG. 6, provided that the first opening 331 and the second opening 341 are arranged along the second direction Y, the areas of the first openings 331 in the same one of the first pixel areas 31 are unequal to each other, and the areas of the second openings 341 in the same one of the first pixel areas 31 are unequal to each other.

In the direction from the display area 10 to the transition area 30, the areas of the first openings 331 in the first pixel area 31 decrease gradually, and the areas of the second openings 341 in the first pixel area 341 decrease gradually.

For example, in the transition area 30, the first area 40 comprises a first pixel area 31, and the first pixel area 31 comprises three sub-pixel areas of the red sub-pixel area, the green sub-pixel area, and the blue sub-pixel area, all of which comprise two openings which are the first opening 331 and the second opening 341. In the first direction X which is a direction from the red sub-pixel area to the blue sub-pixel area, the areas of the first openings 331 arranged in a same row decrease gradually, and in the direction Y, the areas of the openings arranged in a same column decrease gradually.

The present application also provides a display module, and the working principle of the display module is the same as or similar to that of the display panel, hence it is not described herein.

The present application provides a display panel and a display module. The display panel comprises a display area, a non-display area, and a transition area disposed between the display area and the non-display area. The transition area comprises at least the first sub-pixel area arranged along a first direction and/or a second direction, wherein any one of the first sub-pixel areas comprises at least the first opening; the area of the first opening disposed close to the display area is greater than the area of the first opening disposed away from the display area. In the present application, the sub-pixel areas located in the transition area comprise a plurality of openings, wherein the area of the opening disposed close to the display area is greater than the area of the opening disposed away from the display area, resulting in an increased luminance of the sub-pixel, which eliminates a zigzag pattern between the display area and the non-display area and improves display effect of the display panel.

As described above, though the present application has been disclosed with preferred embodiments, the preferred embodiments cannot be viewed as a limitation to the present application, those skilled in the art may make various changes and deformation within the concept and the scope of the present application, and therefore the protection scope of the present application shall be based on the claims.

What is claimed is:
1. A display panel, comprising:
a display area;
a non-display area; and
a transition area disposed between the display area and the non-display area,
wherein the transition area comprises a first sub-pixel area and a second sub-pixel area arranged along a first direction from the display area toward the transition area, and the first sub-pixel area comprises a first opening, and the second sub-pixel area comprises a second opening,
wherein the first opening is disposed closer to the display area than the second opening,
wherein the first opening has an area greater than the area of the second opening,
wherein the area of the first opening decreases gradually in the first direction toward the second opening,
wherein the transition area comprises a first pixel area arranged along the first direction, and the first pixel area comprises the first sub-pixel area, and
wherein the area of the first opening in the first sub-pixel area decreases gradually in the first direction,
wherein: the first pixel area comprises three sub-pixel areas arranged along the first direction; each sub-pixel area contains at least one sub-pixel; colors of the sub-pixels in the first pixel area are different from each other; and a sub-pixel comprises one of a red sub-pixel, a green sub-pixel, and a blue sub-pixel,
wherein the first sub-pixel area comprises the first opening, having a first sub-opening disposed closer to the display area than a second sub-opening, and the first sub-opening and the second sub-opening in the first sub-pixel area are arranged along a second direction which is perpendicular to the first direction,
wherein the area of the second sub-opening is smaller than the area of the first sub-opening, and
wherein:
a first sub-opening and a second sub-opening in the second sub-pixel area are arranged along the second direction; the area of the first sub-opening in the first sub-pixel area is not smaller than the area of the first sub-opening in the second sub-pixel area; the area of the second sub-opening in the first sub-pixel area is not smaller than the area of the second sub-opening in the second sub-pixel area; the area of the first sub-opening of the first sub-pixel area gradually decreases toward the first sub-opening of the second sub-pixel area; and the area of the second sub-opening of the first sub-pixel area gradually decreases toward the second sub-opening of the second sub-pixel area.

2. The display panel of claim 1, wherein:
a line corresponding to the center of the first sub-opening in the first pixel area is parallel to the first direction, and a line corresponding to the center of the second sub-opening in the first pixel area is parallel to the first direction; and
the area of the first sub-opening in the first sub-pixel area is equal to the area of the first sub-opening in the second sub-pixel area, and the area of the second sub-opening in the first sub-pixel area is equal to the area of the second sub-opening in the second sub-pixel area.

3. The display panel of claim 1, wherein the first sub-pixel area is disposed closer to the display area than the second sub-pixel area and is has a greater number of sub-openings than the second sub-pixel area.

4. The display panel of claim 1, wherein in a top view of the display panel, the transition area is an irregular straight line.

5. A display module, comprising a display panel, wherein the display panel comprises:
a display area;
a non-display area; and
a transition area disposed between the display area and the non-display area,
wherein the transition area comprises a first sub-pixel area and a second sub-pixel area arranged along a first direction from the display area toward the transition area, and the first sub-pixel area comprises a first opening, and the second sub-pixel area comprises a second opening,
wherein the first opening is disposed closer to the display area than the second opening,
wherein the first opening has an area greater than the area of the second opening,
wherein the area of the first opening decreases gradually in the first direction toward the second opening, wherein the transition area comprises a first pixel area arranged along the first direction, and the first pixel area comprises the first sub-pixel area, wherein the area of the first opening in the first sub-pixel area decreases gradually in the first direction, wherein: the first pixel area comprises three sub-pixel areas arranged along the first direction; each sub-pixel area contains at least one sub-pixel; colors of the sub-pixels in the first pixel area are different from each other; and a sub-pixel comprises one of a red sub-pixel, a green sub-pixel, and a blue sub-pixel, wherein the first sub-pixel area comprises the first opening, having a first sub-opening disposed closer to the display area than a second sub-opening, and the first sub-opening and the second sub-opening in the first sub-pixel area are arranged along a second direction which is perpendicular to the first direction, wherein the area of the second sub-opening is smaller than the area of the first sub-opening, and wherein: a first sub-opening and a second sub-opening in the second sub-pixel area are arranged along the second direction; the area of the first sub-opening in the first sub-pixel area is not smaller than the area of the first sub-opening in the second sub-pixel area; the area of the second sub-opening in the first sub-pixel area is not smaller than the area of the second sub-opening in the second sub-pixel area; the area of the first sub-opening of the first sub-pixel area gradually decreases toward the first sub-opening of the second sub-pixel area; and the area of the second sub-opening of the first sub-pixel area gradually decreases toward the second sub-opening of the second sub-pixel area.

6. The display module of claim 5, wherein:

a line corresponding to the center of the first sub-opening in the first pixel area is parallel to the first direction, and a line corresponding to the center of the second sub-opening in the first pixel area is parallel to the first direction; and the area of the first sub-opening in the first sub-pixel area is equal to the area of the first sub-opening in the second sub-pixel area, and the area of the second sub-opening in the first sub-pixel area is equal to the area of the second sub-opening in the second sub-pixel area.

7. The display module of claim 5, wherein the first sub-pixel area is disposed closer to the display area than the second sub-pixel area and has a greater number of sub-openings than the second sub-pixel area.

8. The display module of claim 5, wherein in a top view of the display panel, the transition area is an irregular straight line.

* * * * *